(12) United States Patent
Kogan et al.

(10) Patent No.: US 6,765,682 B1
(45) Date of Patent: Jul. 20, 2004

(54) METHOD AND APPARATUS FOR WAVELENGTH AND POWER MEASUREMENT FOR TUNABLE LASER CONTROL

(75) Inventors: Yakov Kogan, Bedford, MA (US); Donald McDaniel, North Andover, MA (US)

(73) Assignee: Nortel Networks Limited, St. Laurent (CA)

( * ) Notice: Subject to any disclaimer, the term of this patent is extended or adjusted under 35 U.S.C. 154(b) by 165 days.

(21) Appl. No.: 10/044,250

(22) Filed: Jan. 11, 2002

(51) Int. Cl.[7] .................................................. G01B 9/02
(52) U.S. Cl. ...................................................... 356/519
(58) Field of Search ........................ 356/519; 372/29.02, 372/29.021, 32

(56) References Cited

U.S. PATENT DOCUMENTS

| | | | | | |
|---|---|---|---|---|---|
| 4,565,935 | A | * | 1/1986 | Rolfe | 327/350 |
| 5,081,378 | A | * | 1/1992 | Watanabe | 327/350 |
| 6,101,200 | A | * | 8/2000 | Burbidge et al. | 372/29.021 |

* cited by examiner

*Primary Examiner*—Samuel A. Turner
*Assistant Examiner*—Michael A. Lyons
(74) *Attorney, Agent, or Firm*—Guerin & Rodriguez, LLP

(57) ABSTRACT

According to an aspect of the present invention, a circuit is provided for determining the wavelength and power of a given optical signal across a wide dynamic range. The wavelength and power determinations are performed by logarithmic ratio amplifier in concert with a digital signal processor that utilizes representative equations of the measured optical signal.

19 Claims, 5 Drawing Sheets

METHOD AND APPARATUS FOR WAVELENGTH AND POWER MEASUREMENT FOR TUNABLE LASER CONTROL

BACKGROUND OF THE INVENTION

As it is known in the telecommunications art, dense wavelength division multiplexing (DWDM) is a technology that allows many wavelengths of light to travel along the same fiberoptic cable. Each of those wavelengths of light convey a stream of data that is filtered and decoded when it reaches an optical DWDM receiver. The DWDM technology significantly increases the amount of data that can be conveyed, at a single time, across a fiberoptic cable and hence is becoming highly utilized. Because the DWDM technology uses many different wavelengths of light, it has generated increasing interest in laser designs that can be tuned to any of those wavelengths. One such type of a laser is referred to as a tunable vertical cavity semiconductor laser (VCSEL).

In order to tune the output of a VCSEL, or other type of tunable laser, to a desired wavelength, a control circuit is manipulated such that the output ramps through a range of wavelengths. The output signal is monitored until it meets the desired wavelength criteria. At that time it is locked into place through further manipulation of the control circuit. In order to perform this tuning operation, a monitor is needed that has a wide dynamic range in both the power and wavelength domains. For example, in the case where a tunable laser wavelength is judged by the transmission through a wavelength dependent etalon to control the laser frequency within +/−5 pm within the band of 100 nm (43 dB) and power within the band of 3 dB, a circuit having a dynamic range of at least 46 dB dynamic range is needed. It is also important to be able to monitor and control the wavelength and power of the VCSEL independently from each other across a wide environmental range of temperature and humidity.

Accordingly, a mechanism is needed for providing accurate and reliable wavelength and power measurements across wide dynamic operating ranges and wide dynamic environmental ranges.

SUMMARY OF THE INVENTION

In accordance with an aspect of the present invention, a system for determining the power and wavelength of an optical signal is provided. The system includes a pair of beam splitters and etalons with known transmission characteristics for receiving portions of the optical signal. Optical detectors generate electrical signals that are representative of the optical signal based upon the output of the etalons.

The electrical signals are received by a circuit that responsively generates a first output signal that is wavelength and power dependent and a second output signal that is wavelength dependent. A processor receives those signals and determines the wavelength from said second output signal and the power from the first output signal. The processor can do this by converting the electrical signal to a digital signal represented by characteristic equations and then solving those equations for the unknown values.

With such an embodiment, the characteristics of an unknown optical signal can be quickly determined.

BRIEF DESCRIPTION OF THE DRAWINGS

In the drawings, like reference characters refer to the same parts throughout the different views. The drawings are not necessarily to scale, emphasis instead being placed upon illustrating the principles of the invention. Of the drawings.

DESCRIPTION OF A PREFERRED EMBODIMENT

Figure 1:
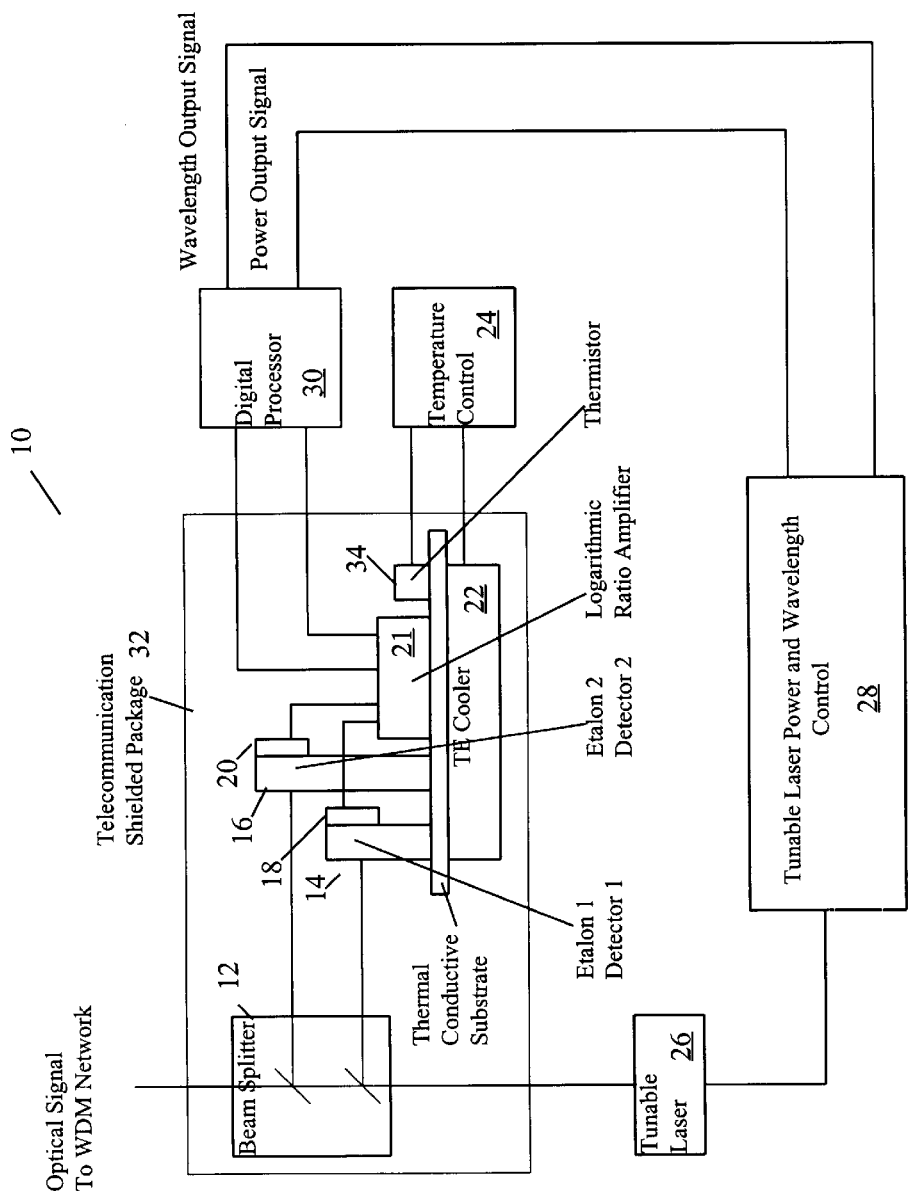
FIG. 1 depicts an optical wavelength and power detector system according to an aspect of the present invention.

Referring to FIG. 1, a system layout is shown according to the present invention. System 10 includes a beam splitter 12, a pair of etalons (14,16) and their associated optical detectors (18,20), a thermal electric cooler (TEC) 22 and its associated thermal control circuit 24, tunable laser 26, tunable laser power and wavelength controller 28 and a digital signal processor 30. Light from the tunable laser 26 is fed into beam splitter 12 having two taps. Light from each of the taps is independently directed to etalons 14 and 16. The associated photo detectors 18 and 20 receive the light signal and convert its optical power into electric signals that are fed into a differential logarithmic ratio amplifier 21. The output signals of this amplifier 21 are fed into the Digital Processor 30 that performs an analog-to-digital conversion and calculates the associated wavelength and power values. Those values are input to the Tunable Laser Wavelength and Power Control circuit 28 to provide feedback adjustment to the tunable laser.

As described in (U.S. patent application Ser. No. 09/847,506), incorporated herein by reference, the wavelength and power measurements generated from the optical signal provide industrially useful results across a wide dynamic range when the optical and electrical portions of the system (i.e. Beam splitter 12, wavelength etalons 14,16, photo detectors 18, 20 and differential logarithmic amplifiers 21) are mounted on a thermal conductive substrate inside a shielded telecommunication package 32. The temperature of the assembly inside the package is maintained constant by the temperature control circuit 24 in conjunction with the thermal electric cooler (TEC) 22 and thermistor 34.

Figure 2:
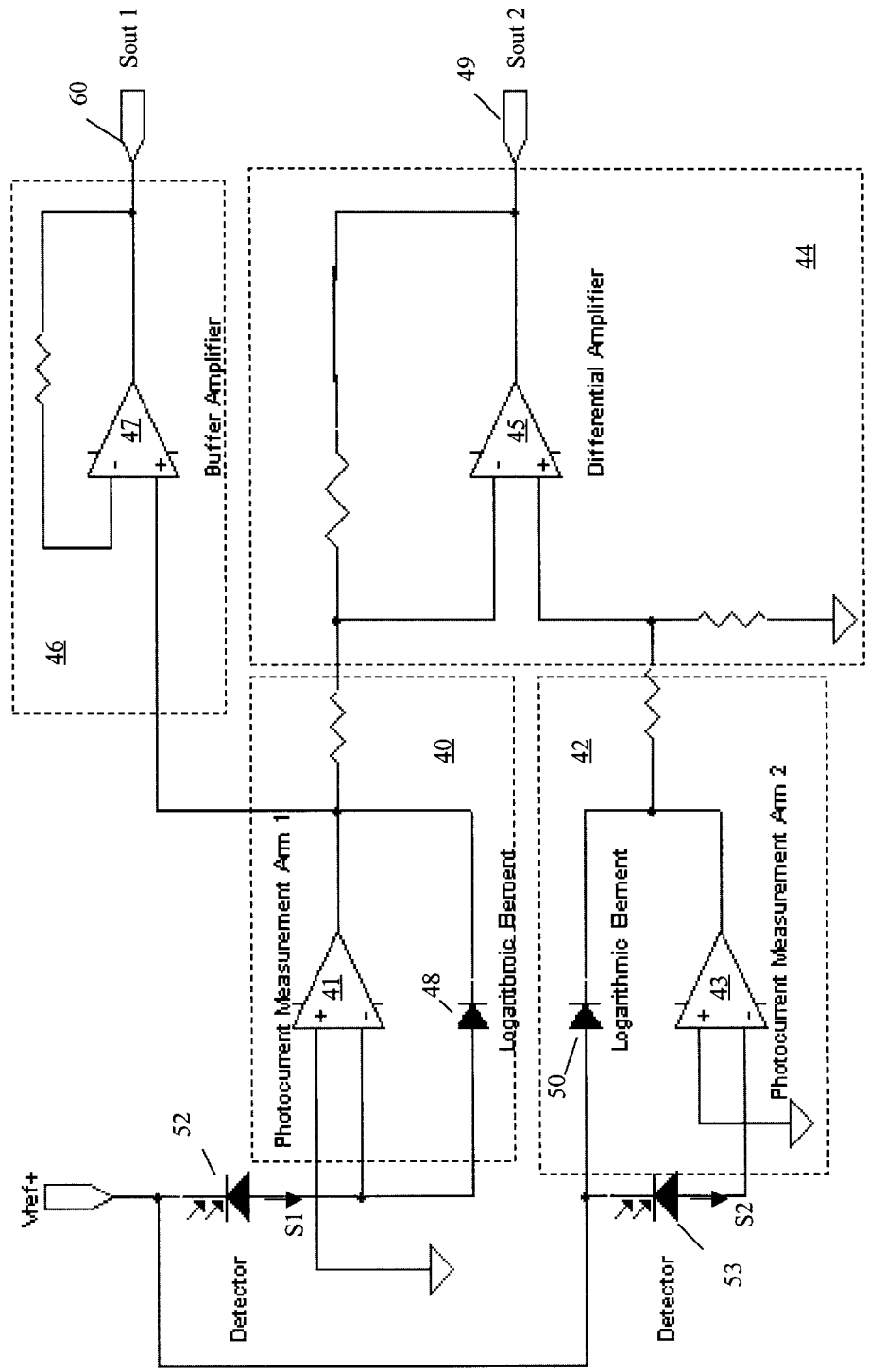
FIG. 2 depicts a circuit diagram of the logarithmic ratio amplifier of FIG. 1.

Referring now to FIG. 2, a circuit diagram of logarithmic ratio amplifier 21 is depicted. Logarithmic ratio amplifier 21 includes a first measurement arm 40, a second measurement arm 42, a differential amplifier stage 44 and a buffer amplifier stage 46. Essentially, the output 49 of differential amplifier stage 44 is a function of the wavelength of the original light signal from tunable laser 26, and the output 47 of buffer amplifier stage 46 is a function of the power and wavelength of the light signal from tunable laser 26. Those signals are fed into digital signal processor 30 such that the wavelength is calculated from signal 47 and the power can be derived from signal 46 in conjunction with the calculated wavelength.

The operation of the circuit shown in FIG. 2 will now be described more specifically. After the light signal from tunable laser 26 passes through beam splitter 12, it is received at each of the etalon/optical detector pairs (14/18 and 16/20). The optical detectors 18 and 20 convert the optical signal into a representative electrical signal. Those electrical signals can be represented as the product of a known optical power transmission coefficient (k), a known function representing the wavelength dependent transmission of the light through the associated etalon (F($\lambda$)), and the power of the light ($P_{laser}$) to be determined. Accordingly, the output signal from detector 52 is represented by the equation $S_1=k_1F_1(\lambda)P_{laser}$ and the output signal from detector 53 is represented by $S_2=k_2F_2(\lambda)P_{laser}$. Signal $S_1$ is modified by amplifier 41 and buffer amplifier 47 to generate output signal 60 ($S_{out1}$). Output signal 60 can be represented by the following formula: $S_{out1}=\log[k_{amp1}(k_1F_1(\lambda))]$ where $k_{amp2}$ is the gain or amplification constant for the signal path. It should be recognized that output signal 60 is dependent on the power of laser 26, and hence can be used to determine the power once the wavelength is determined.

Likewise, signal $S_2$ is modified by amplifier 41 and is transmitted to differential amplifier 45. Differential amplifier 45 determines the difference between that signal and the output from measurement arm 40 and thereby generates output signal 49 ($S_{out2}$). Output signal 49 can be represented by the following formula: $S_{out}=\log[(k_{amp2}k_2F_2(\lambda))/(k_1F_1\lambda)]$ where $k_{amp2}$ is the gain or amplification constant for the signal path and $k_2$ is the optical power transmission and conversion coefficient. It should be recognized that output signal 49 is independent of the power of laser 26 and that functions $F_1(\lambda)$ and $F_2(\lambda)$ are known. Accordingly, since the wavelength of the light output from laser 26 is the only unknown value in the representative equation, it can be determined by digital processor 30. Once the wavelength is determined, and since the power of the light output from laser 26 ($P_{laser}$) is the only unknown, it can be determined from output signal 47.

It will be recognized that in order to achieve a wide dynamic operating range, the beam splitter 12, etalons 14, 16, detectors 18, 20, and logarithmic ratio amplifier circuit 21 can be mounted on a thermal electric cooler or similar structure. In such a manner, temperature dependent errors are removed from the output signals thereby improving the accuracy of the wavelength and power calculations.

Figure 3:
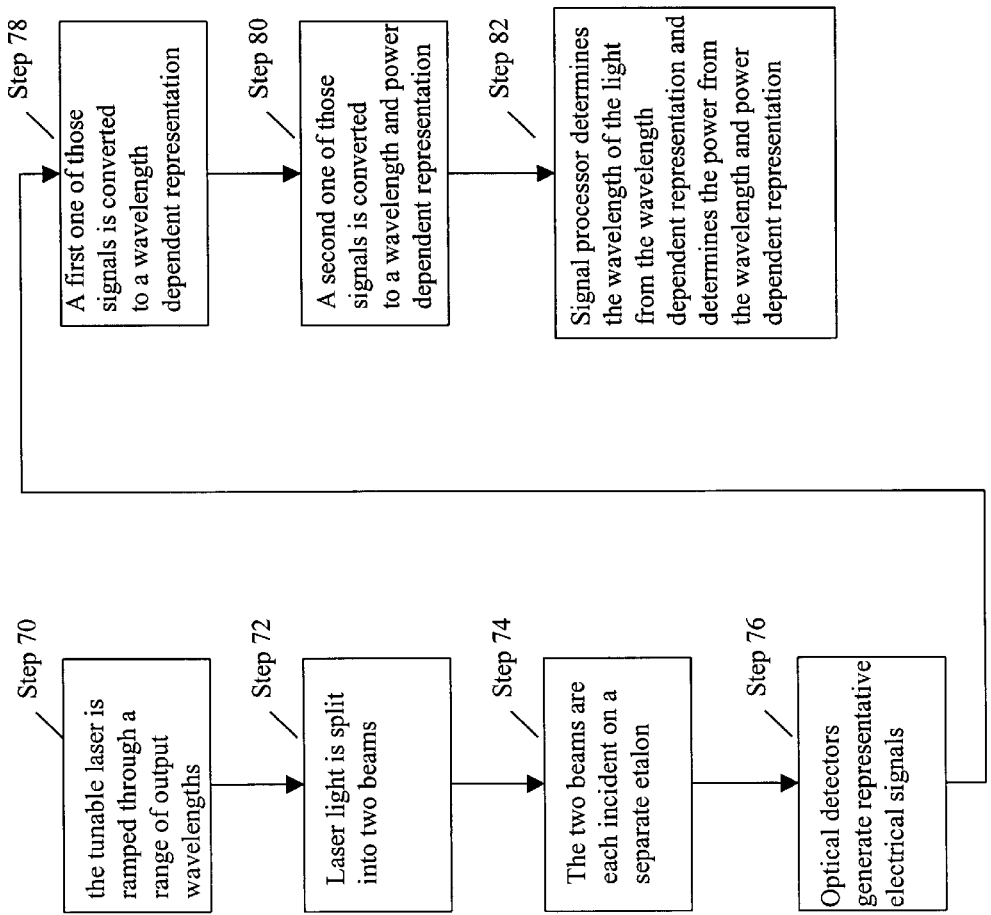
FIG. 3 depicts a flow diagram of the operation of the optical wavelength and power detector of FIG. 1.

Referring now to FIG. 3, a flow diagram of the method for determining the wavelength and power values of the light from tunable laser 26 is shown. It will be recognized that the method may be implemented using other analog or digital circuits that perform the same operations as described herein. Accordingly, the process begins when the tunable laser is ramped through a range of output wavelengths (Step 70). The laser light is transmitted to a mechanism for splitting the beam into at least two beams (Step 72). The two laser beams are incident on etalons or similar structures having known transmission characteristics (Step 74). The light output from each of the etalons is converted to representative electrical signals by optical detectors (Step 76). A first one of those signals is input to a circuit stage that converts it to a wavelength dependent representation (Step 78). In other words, when the signal is analyzed by the signal processor, it can be represented by an equation whose only unknown value is the optical wavelength of the laser light.

A second one of those signals is input to another circuit stage that converts it to a wavelength and power dependent representation (Step 80). Accordingly, the signal processor determines the wavelength from the wavelength dependent representation and uses that value to determine the power from the wavelength and power dependent representation (Step 82). In such a manner both the wavelength and power of the tunable laser can be quickly determined.

In an alternative embodiment, both signals that are fed into digital processor 30 can be wavelength and power dependent. The actual values of power and wavelength can be determined by the digital processor 30 solving the system of two equations for the two unknown variables.

In another alternative embodiment, the present invention can be used to monitor the wavelength and power of a fixed wavelength laser.

Figure 4:
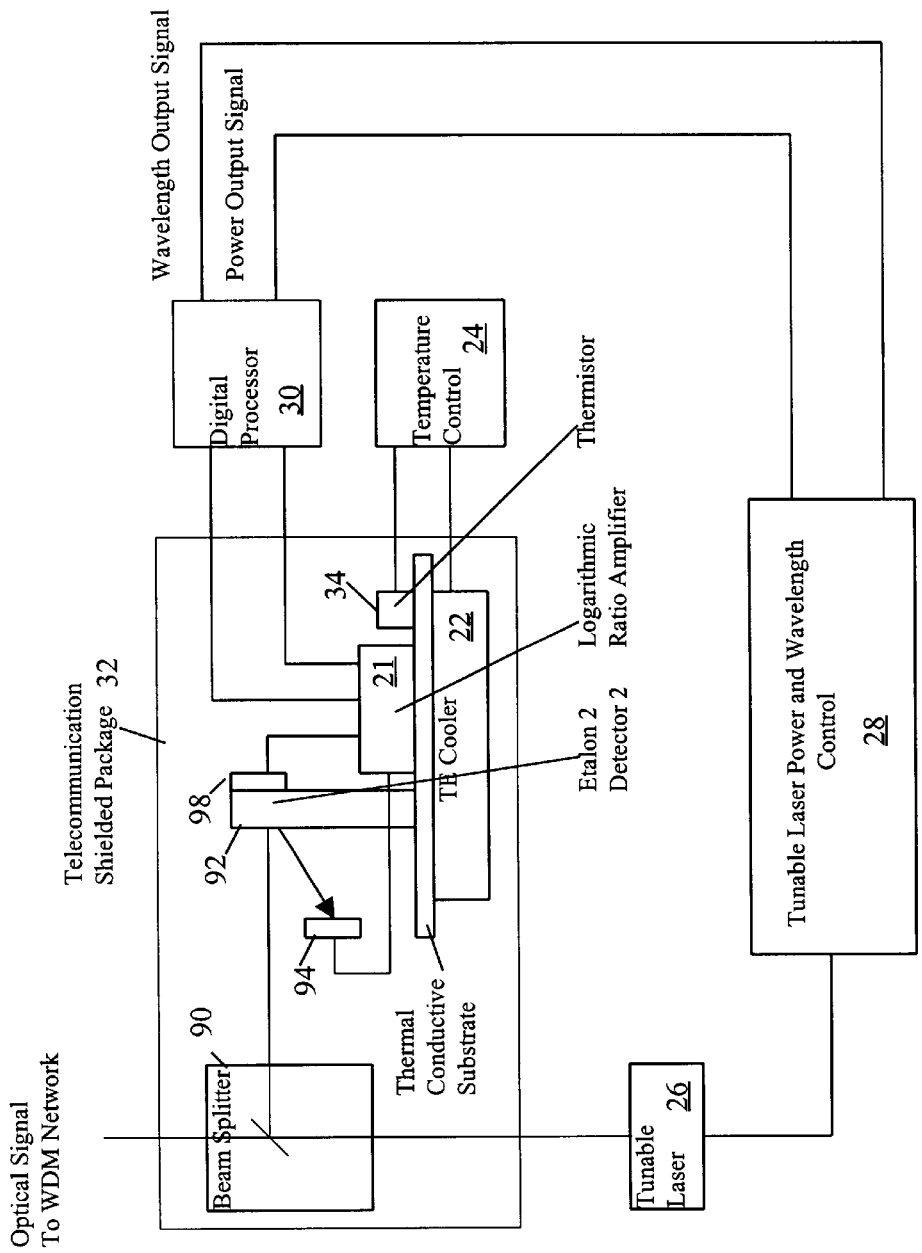
FIG. 4 depicts an optical wavelength and power detector system according to another aspect of the present invention.

Referring now to FIG. 4, a still further embodiment is shown to include a single beam splitter 90 and etalon 92. The first detector 94 receives the reflected signal from the etalon 92 while the second detector 98 receives the signal transmitted through the etalon 92. From these two signals the power and wavelength determinations can be performed as otherwise described herein.

Figure 5:
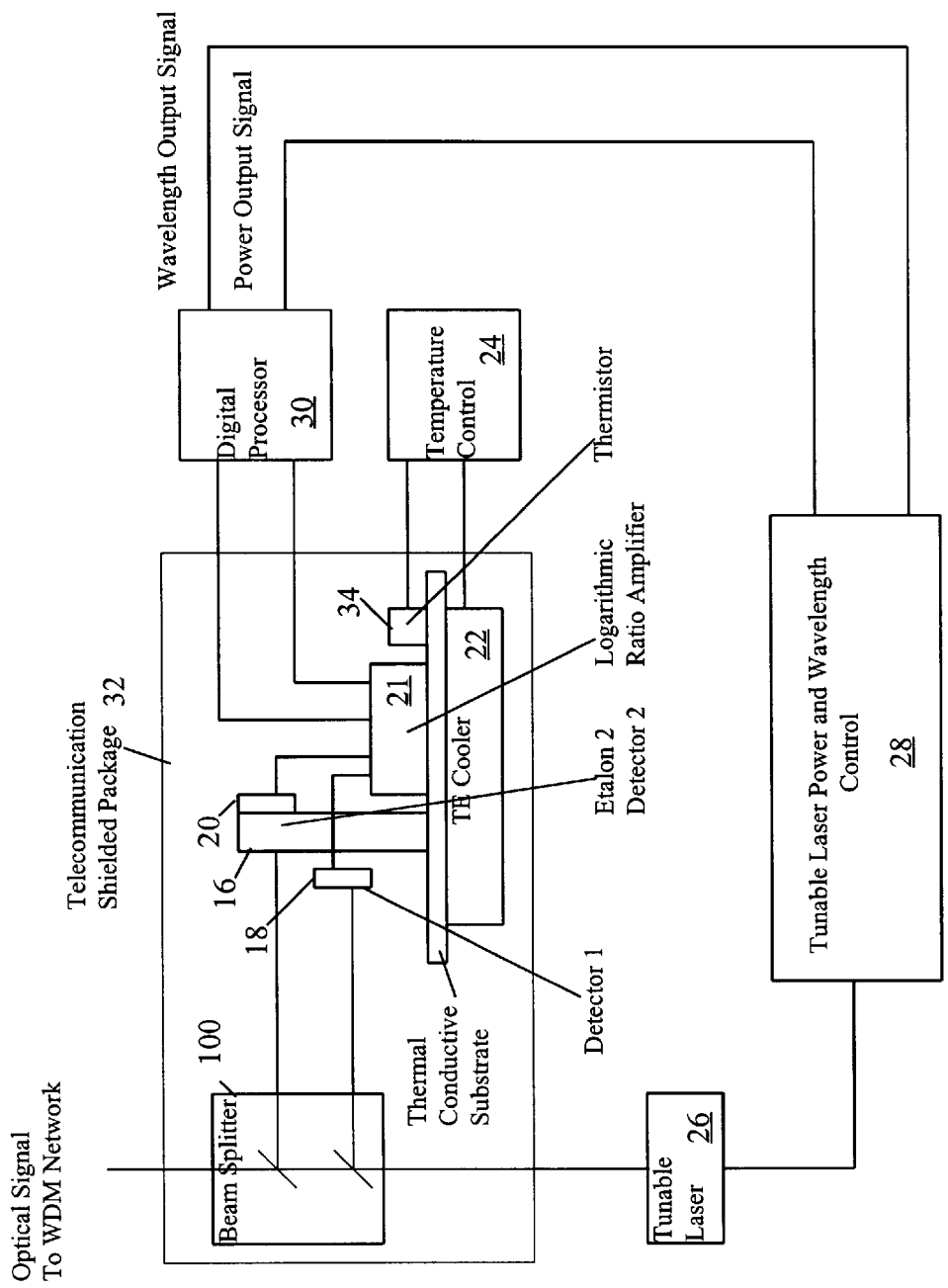
FIG. 5 depicts an optical wavelength and power detector system according to another aspect of the present invention.

Referring now to FIG. 5, a still further embodiment of the present invention is shown to include a beam splitter 100 having two taps. The signal from one of the taps is received by an etalon/detector pair (16,20), as described herein above. The signal from the other tap is received by only an optical detector 18. Digital Processor 30 uses this signal to determine the optical power of the laser. Digital Processor 30 uses the measurement of the first signal which is wavelength dependent to find laser wavelength.

It will be recognized that many configurations similar to those described above can be designed using different values, combinations and architectures which will yield the same results as the claimed invention. Thus, while this invention has been particularly shown and described with references to preferred embodiments herein, it is understood by those skilled in the art that various changes in form and details may be made therein without departing from the scope of the invention as defined by the appended claims.

What is claimed is:

1. An apparatus for determining at least a first characteristic and a second characteristic of an optical signal, comprising:

a first etalon, for receiving a first portion of said optical signal, coupled to a first optical detector, for generating a first electrical signal representative of said optical signal, the first etalon having a first predetermined wavelength dependent transmission function;

a second etalon, for receiving a second portion of said optical signal, coupled to a second optical detector for generating a second electrical signal representative of said optical signal, the second etalon having a second predetermined wavelength dependent transmission function that is different than the first predetermined wavelength dependent transmission function;

a circuit for receiving said first and said second electrical signals and for generating at least a first output signal dependent on said first and said second characteristics and for generating at least a second output signal dependent on said first characteristic of said optical signal; and a processor for receiving said first and said second output signals and for determining said first characteristic from said second output signal and determining said second characteristic from said determined first characteristic and said first output signal.

2. An apparatus for determining at least a first characteristic and a second characteristic of an optical signal, as described in claim 1, wherein said first etalon has a predetermined wavelength dependent transmission function ($F_1(\lambda)$) and wherein said second etalon has a predetermined wavelength dependent transmission function ($F_2(\lambda)$).

3. An apparatus for determining at least a first characteristic and a second characteristic of an optical signal, as described in claim 1, wherein said second characteristic is the wavelength of said optical signal.

4. An apparatus for determining at least a first characteristic and a second characteristic of an optical signal, as described in claim 1, wherein said first characteristic is the power of said optical signal.

5. An apparatus for determining at least a first characteristic and a second characteristic of an optical signal, as described in claim 1, wherein said first output signal is represented by the equation $\log [k_{amp1}(k_1 F_1(\lambda) P_{laser}]$ where $k_{amp1}$ is a gain constant for a path from said first optical detector through said circuit, $k_1$ is an optical power transmission coefficient constant, $P_{laser}$ is the second characteristic and $F_1(\lambda)$ is a predetermined transmission function of said first etalon that is dependent on said second characteristic.

6. An apparatus for determining at least a first characteristic and a second characteristic of an optical signal, as described in claim 5, wherein said second output signal is represented by the equation $\log [(k_{amp2} k_2 F_2(\lambda)/(k_1 F_1(\lambda))]$ where $k_{amp2}$ is a gain constant for a path from said second optical detector through said circuit, $k_2$ is an optical power transmission coefficient constant and $F_2(\lambda)$ is a predetermined transmission function of said second etalon that is dependent on said first characteristic.

7. An apparatus for determining at least a first characteristic and a second characteristic of an optical signal, as described in claim 1, wherein said circuit comprises:

A first measurement stage for receiving said first electrical signal;

A second measurement stage for receiving said second electrical signal;

A buffer amplifier stage for receiving an output of said first measurement stage and generating said second output signal; and A differential amplifier stage for receiving an output of said first and second measurement stages and for generating said first output signal.

8. An apparatus for determining at least a first characteristic and a second characteristic of an optical signal, as described in claim 7 wherein said first measurement stage comprises:

An amplifier having a logarithmic element in a feedback path connecting an inverting input and the first electrical signal to an output of the amplifier.

9. An apparatus for determining at least a first characteristic and a second characteristic of an optical signal, as described in claim 8 wherein said second measurement stage comprises an amplifier having a logarithmic element in a feedback path connecting an inverting input and the second electrical signal to an output of the amplifier.

10. An apparatus for determining at least a first characteristic and a second characteristic of an optical signal, as described in claim 9, wherein the differential amplifier stage comprises a differential amplifier for receiving the output of said first measurement stage at a first input and the output of said second measurement stage at a second input, for determining a difference between both output signals.

11. An apparatus for determining at least a first characteristic and a second characteristic of an optical signal, as described in claim 1, wherein the first and second output signals are analog signals and the processor converts the first and second output signals to digital signals before determining said first and second characteristics therefrom.

12. A method for determining a power characteristic and a wavelength characteristic of an optical signal, comprising:

Splitting the optical signal into a first optical beam incident on a first etalon and a second optical beam incident on a second etalon, wherein each etalon has known different transmission characteristics;

Converting output beams from the first and second etalons into a first representative electrical signal and a second representative electrical signal, respectively;

Converting the first representative electrical signal into a wavelength dependent representation;

Converting the second representative electrical signal into a wavelength and power dependent representation; and Determining the wavelength characteristic of the optical signal from the wavelength dependent representation and determining the power characteristic of the optical signal from the wavelength and power dependent representation using the determined wavelength characteristic.

13. A method for determining a power characteristic and a wavelength characteristic of an optical signal, as described in claim 12, wherein said wavelength and power dependent representation is represented by the equation $\log [k_{amp1} (k_1 F_1(\lambda) P_{laser})]$ where $k_{amp1}$ is a gain constant, $k_1$ is an optical power transmission coefficient constant, $P_{laser}$ is the power characteristic and $F_1(\lambda)$ is a predetermined transmission function of said first etalon that is dependent on said wavelength characteristic.

14. A method for determining a power characteristic and a wavelength characteristic of an optical signal, as described in claim 13, wherein said wavelength dependent representation is represented by the equation $\log [(k_{amp2} k_2 F_2(\lambda)/(k_1 F_1(\lambda))]$ where $k_{amp2}$ is a gain constant, $k_2$ is an optical power transmission coefficient constant and $F_2(\lambda)$ is a predetermined transmission function of said second etalon that is dependent on said wavelength characteristic.

15. A method for determining a power characteristic and a wavelength characteristic of an optical signal, as described in claim 14, wherein a digital signal processor performs the steps of converting the first representative electrical signal into said wavelength dependent representation.

16. A method for determining a power characteristic and a wavelength characteristic of an optical signal, as described in claim 15, wherein said digital signal processor performs the steps of converting the second representative electrical signal into said wavelength and power dependent representation.

17. A method for determining a power characteristic and a wavelength characteristic of an optical signal, as described in claim 16, wherein said digital signal processor performs the step of determining the wavelength characteristic of the optical signal from the wavelength dependent representation and determining the power characteristic of the optical signal from the wavelength and power dependent representation using the determined wavelength characteristic.

18. An apparatus for determining at least a first characteristic and a second characteristic of an optical signal, comprising:

an etalon, for receiving a first portion of said optical signal, coupled to a first optical detector, for generating a first electrical signal representative of said optical signal transmitted through said etalon;

a second optical detector, for receiving a second portion of said optical signal reflected from said etalon, for generating a second electrical signal representative of said optical signal;

a circuit for receiving said first and said second electrical signals and for generating at least a first output signal dependent on said first and said second characteristics and for generating at least a second output signal dependent on said first and said second characteristics of said optical signal; and a processor for receiving said first and said second output signals and for determining said first characteristic and said second characteristic from said second output signal and determining said second characteristic from said first and second output signals.

19. An apparatus for determining at least a first characteristic and a second characteristic of an optical signal, comprising:

a beam splitter for separating said optical signal into at least a first portion and a second portion; an etalon, for receiving the first portion of said optical signal, coupled to a first optical detector, for generating a first electrical signal representative of said optical signal;

a second detector for receiving a second portion of said optical signal, for generating a second electrical signal representative of said optical signal;

a circuit for receiving said first and said second electrical signals and for generating at least a first output signal dependent on said first characteristic and for generating at least a second output signal dependent on said second characteristic of said optical signal; and a processor for receiving said first and said second output signals and for determining said first characteristic from said first output signal and determining said second characteristic from said second output signal.

* * * * *